United States Patent
Chen et al.

[19]

[11] Patent Number: 6,020,078
[45] Date of Patent: Feb. 1, 2000

[54] GREEN ORGANIC ELECTROLUMINESCENT DEVICES

[75] Inventors: Chin H. Chen, Mendon; Ching W. Tang, Rochester; Jianmin Shi, Webster; Kevin P. Klubek, Rochester, all of N.Y.

[73] Assignee: Eastman Kodak Company, Rochester, N.Y.

[21] Appl. No.: 09/216,238

[22] Filed: Dec. 18, 1998

[51] Int. Cl.$^7$ .................................. H05B 33/14
[52] U.S. Cl. .................. 428/690; 428/917; 313/504
[58] Field of Search ................. 428/690, 917; 313/504

[56] References Cited

U.S. PATENT DOCUMENTS

| | | |
|---|---|---|
| 3,172,862 | 3/1965 | Gurnee et al. . |
| 3,173,050 | 3/1965 | Gurnee . |
| 3,180,730 | 4/1965 | Klupfel et al. . |
| 3,567,450 | 3/1971 | Brantly et al. . |
| 3,658,520 | 4/1972 | Brantly et al. . |
| 3,710,167 | 1/1973 | Dresner et al. . |
| 3,935,031 | 1/1976 | Adler . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 4,950,950 | 8/1990 | Perry et al. . |
| 5,047,687 | 9/1991 | VanSlyke . |
| 5,059,861 | 10/1991 | Littman et al. . |
| 5,059,862 | 10/1991 | VanSlyke et al. . |
| 5,061,569 | 10/1991 | VanSlyke et al. . |
| 5,069,975 | 12/1991 | Nakada et al. . |
| 5,074,446 | 12/1991 | Suddath . |
| 5,104,740 | 4/1992 | Shinkai et al. . |
| 5,122,711 | 6/1992 | Wakimoto et al. . |
| 5,126,214 | 6/1992 | Tokailin et al. . |
| 5,141,671 | 8/1992 | Bryan et al. . |
| 5,142,343 | 8/1992 | Hosokawa et al. . |
| 5,150,006 | 9/1992 | VanSlyke et al. . |
| 5,151,629 | 9/1992 | VanSlyke . |
| 5,227,252 | 7/1993 | Murayama et al. . |
| 5,256,945 | 10/1993 | Imai et al. . |
| 5,366,811 | 11/1994 | Higashi et al. . |
| 5,389,444 | 2/1995 | Hosokawa et al. . |
| 5,458,977 | 10/1995 | Hosokawa et al. . |

OTHER PUBLICATIONS

"Organic Electroluminescent Diodes" by C.W. Tang and S.A. VanSlyke, Applied Phys. Lett. 51(12), Sep. 21, 1987, pp. 913–915.

*Primary Examiner*—Charles Nold
*Attorney, Agent, or Firm*—Raymond L. Owens

[57] ABSTRACT

An organic EL device, including an anode and a cathode, and at least one organic luminescent layer containing a compound of the formula:

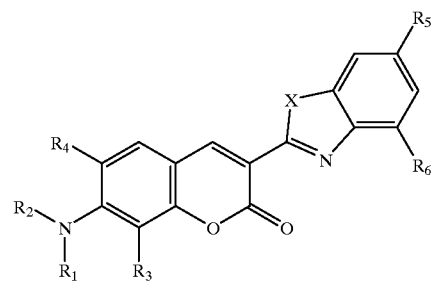

wherein:
  X=S, or O
  $R_1$, and $R_2$ are individually alkyl of from 1 to 20 carbon atoms, aryl or carbocyclic systems;
  $R_3$, and $R_4$ are individually alkyl of from 1 to 10 carbon atoms, or a branched or unbranched 5 or 6 member substituent ring connecting with $R_1$, $R_2$ respectively; and
  $R_5$ and $R_6$ are individually alkyl of from 1 to 20 carbon atoms, which are branched or unbranched.

6 Claims, 3 Drawing Sheets

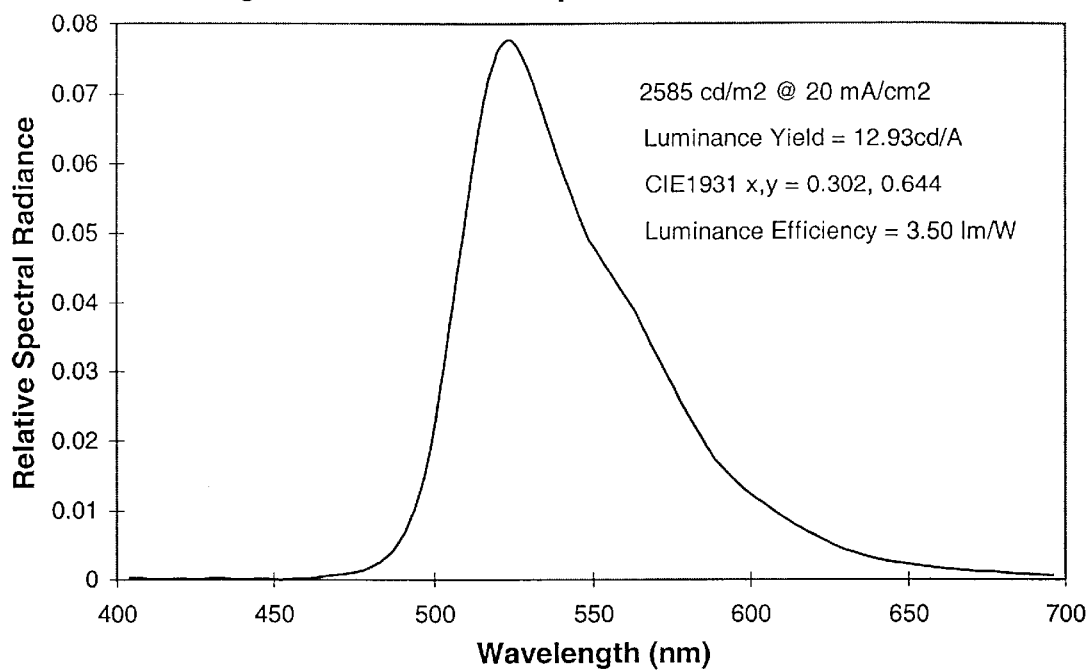
Fig. 4 C-545TB EL Spectral Characteristics

GREEN ORGANIC ELECTROLUMINESCENT DEVICES

FIELD OF THE INVENTION

This invention relates to organic electroluminescent (EL) devices. More specifically, this invention relates to very efficient green EL devices.

BACKGROUND OF THE INVENTION

Organic EL devices are known to be highly efficient and are capable of producing a wide range of colors. Useful applications such as flat-panel displays have been contemplated. Representative of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene," RCA Review, Vol. 30, pp.322–334, 1969; and Dresner U.S. Pat. No. 3,710,167, issued Jan. 9, 1973. Typical organic emitting materials were formed of a conjugated organic host material and a conjugated organic activating agent having condensed benzene rings. Naphthalene, anthracene, phenanthrene, pyrene, benzopyrene, chrysene, picene, carbazole, fluorene, biphenyl, terphenyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic emitting material was present as a single layer medium having a thickness much above 1 micrometer. Thus, this organic EL medium was highly resistive and the EL device required a relatively high voltage (>100 volts) to operate.

The most recent discoveries in the art of organic EL device construction have resulted in devices having the organic EL medium consisting of extremely thin layers (<1.0 micrometer in combined thickness) separating the anode and cathode. Herein, the organic EL medium is defined as the organic composition between the anode and cathode electrodes. In a basic two-layer EL device structure, one organic layer is specifically chosen to inject and transport holes and the other organic layer is specifically chosen to inject and transport electrons. The interface between the two layers provides an efficient site for the recombination of the injected hole-electron pair and resultant electroluminescence. The extremely thin organic EL medium offers reduced resistance, permitting higher current densities for a given level of electrical bias voltage. Since light emission is directly related to current density through the organic EL medium, the thin layers coupled with increased charge injection and transport efficiencies have allowed acceptable light emission levels (e.g. brightness levels capable of being visually detected in ambient light) to be achieved with low applied voltages in ranges compatible with integrated circuit drivers, such as field effect transistors.

Further improvement in organic EL devices such as color, stability, efficiency and fabrication methods have been disclosed in U.S. Pat. Nos: 4,356,429; 4,539,507; 4,720,432; 4,885,211; 5,151,629; 5,150,006; 5,141,671; 5,073,446; 5,061,569; 5,059,862; 5,059,861; 5,047,687; 4,950,950; 4,769,292; 5,104,740; 5,227,252; 5,256,945; 5,069,975; 5,122,711; 5,366,811; 5,126,214; 5,142,343; 5,389,444; and 5,458,977.

For the production of full-color EL display panel, it is necessary to have efficient red, green and blue (RGB) EL materials with proper chromaticity and sufficient luminance efficiency. The guest-host doped system offers a ready avenue for achieving such an objective, mainly because a single host with optimized transport and luminescent properties may be used together with various guest dopants leading to EL of desirable hue.

A doped EL system based on the principle of guest-host energy transfer to effect the spectral shift from tris-(8-hydroxyquinolinato)aluminum (Alq) to the dopant molecules has been disclosed by Tang et al in commonly assigned U.S. Pat. No. 4,769,292. Alq is a suitable host for red EL emitters since its emission at 530 nm is adequate to sensitize guest EL emission in the red spectral region. The preferred dopants chosen to provide the green emission in this prior art were 3-(2'-benzothiazolyl)-7-diethylaminocoumarin, commonly known as coumarin-6 (or C-6) and 10-(2-benzothiazolyl)- 1,1,7,7-tetramethyl-2,3,6,7-tetrahydro-1H,5H,11H-[1]benzopyrano[6,7,8-ij]quinolizin-11-one, better known as coumarin-545T (or C-545T). The use of these green fluorescent dyes in electroluminescent devices have been described in U.S. Pat. No. 4,769,292 and Japanese Kokai No. 6-9952 (or JP 06009952-A), respectively. These molecules generally have a high photoluminescence (PL) quantum yield in dilute solution and their green electroluminescent efficiencies are high when doped at the appropriate concentration level in EL devices using Alq as host emitter.

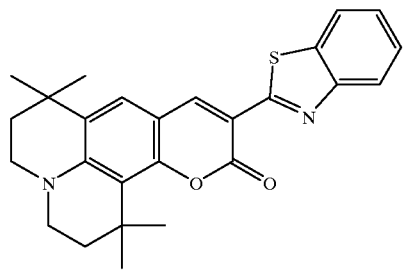

C-545T

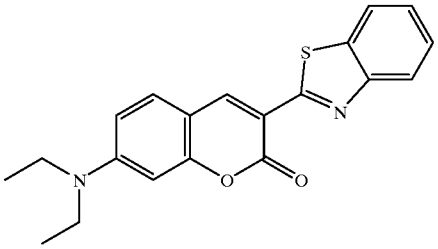

C-6

However, these coumarin derivatives usually have relatively low glass transition temperatures (Tg) which will impact on the thermal stability of the devices. Coumarin-6 does not have an observable Tg in DSC as it possesses a high degree of crystallinity which can ultimately impact on the thin-film morphology of the emitter layer in the device. Furthermore, in EL applications, there are always needs to modify the dopant structure to enhance the EL efficiency in the devices to save the power consumption. The higher the EL efficiency in terms of cd/A in a given device structure and drive condition, the less power it will need to produce the desired green emission with a set of the desired 1931 CIE x,y coordinates. Specific substituents, therefore, are needed to increase the Tg of the green coumarin dopants in order to increase the thermal stability of the EL devices without significantly effecting the color of the emission. Specific substituents are also needed to enhance the EL efficiency of a given green emitting EL device based on coumarin/Alq (guest/host) emitter without significantly effecting the color of the emission in terms of its CIE x,y coordinates. Accordingly, it is desirable to provide a high Tg fluorescent compound in the class of coumarins useful in EL applications which has an enhanced high EL efficiency and a desired EL emission in the green which is similar in color as C-6 or C-545T, respectively.

SUMMARY OF THE INVENTION

It is an object of the present invention to provide an improved green emitting organic EL device with high thermal stability.

This object is achieved by an organic EL device, comprising an anode and a cathode, and at least one organic luminescent layer containing a compound of the formula:

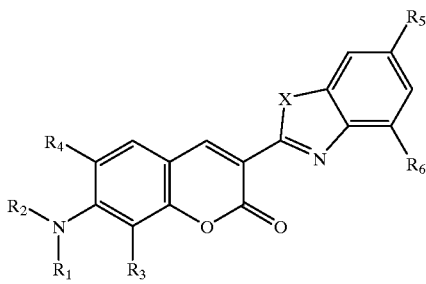

wherein:

X=S, or O $R_1$, and $R_2$ are individually alkyl of from 1 to 20 carbon atoms, aryl or carbocyclic systems;

$R_3$, and $R_4$ are individually alkyl of from 1 to 10 carbon atoms, or a branched or unbranched 5 or 6 member substituent ring connecting with $R_1$, $R_2$ respectively; and $R_5$ and $R_6$ are individually alkyl of from 1 to 20 carbon atoms, which are branched or unbranched.

It is a feature of the present invention that these compounds provide higher Tg than those provided by C-6 and C-545T, respectively.

It is another feature of the present invention that when the compound is applied to a given EL devices it provides the same green EL emission with similar CIE x,y chromaticity.

It is another feature of the present invention that the compound provides unexpected higher electroluminescent efficiency than compounds without attached t-butyl groups on the benzothiazole or benzoxazole ring. Moreover, the fluorescent compound is more resistive to concentration quenching and the bulky t-butyl substitution does not significantly changed the chromaticity characteristics of the parent compound.

BRIEF DESCRIPTION OF THE DRAWINGS

These and other advantages of this invention can be better appreciated by reference to the following detailed description considered in conjunction with the drawings in which:

FIG. 4 shows the plot of the spectral characteristics and EL performance of an EL device which uses the compound C-545TB as green dopant in accordance with the present invention.

DETAILED DESCRIPTION OF THE PREFERRED EMBODIMENTS

Figure 1:
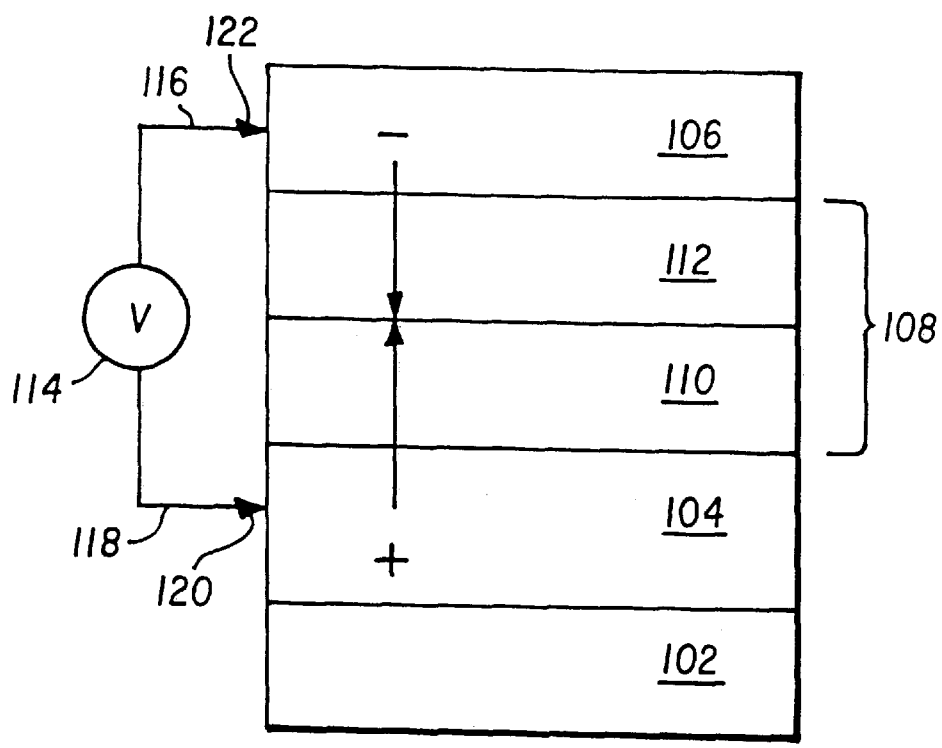
FIGS. 1, 2, and 3 are schematic diagrams of the multilayer structures of preferred EL devices which can employ the compound of this invention.

An EL device 100 according to the invention is schematically illustrated in FIG. 1. Support is provided by layer 102 which is an electrically insulating and optically transparent material such as glass or plastic. Anode 104 is separated from cathode 106 by an organic EL medium 108, which, as shown, consists of two superimposed layers of organic thin films. Layer 110 located on the anode forms a hole-transport layer of the organic EL medium. Located above the hole-transport layer 110 is layer 112, which forms an electron-transport layer of the organic EL medium. The anode 104 and the cathode 106 are connected to an external AC or DC power source 114 by conductors 116 and 118, respectively. The power source 114 can be pulsed, periodic, or continuous.

In operation, the EL device 100 can be viewed as a diode which is forward biased when the anode 104 is at a higher potential then the cathode 106. Under these conditions, holes 120 (positive charge carriers) are injected from the anode 104 into the hole-transport layer 110, and electrons are injected into the electron-transport layer 112. The injected holes and electrons each migrate toward the oppositely charged electrode, as shown by the arrows 120 and 122, respectively. This results in hole-electron recombination and a release of energy in part as light, thus producing electroluminescence.

The region where the hole and electron recombine is known as the recombination zone. The two-layer device structure is designed specifically to confine the recombination at the vicinity near the interface between the hole-transport layer 110 and the electron-transport layer 112 where the probability for producing electroluminescence is the highest. This recombination confinement scheme has been disclosed by Tang and Van Slyke [Applied Physics Letters, Volume 51, Page 913, 1987] and is done by choosing carrier injecting electrodes of suitable work-functions and transport materials of a proper carrier mobility. Away from this interface between the organic layers and in particular at or near the injecting electrodes, the recombination of hole and electron would generally be much less radiative due to the effect of radiative quenching by a conducting surface.

Figure 2:
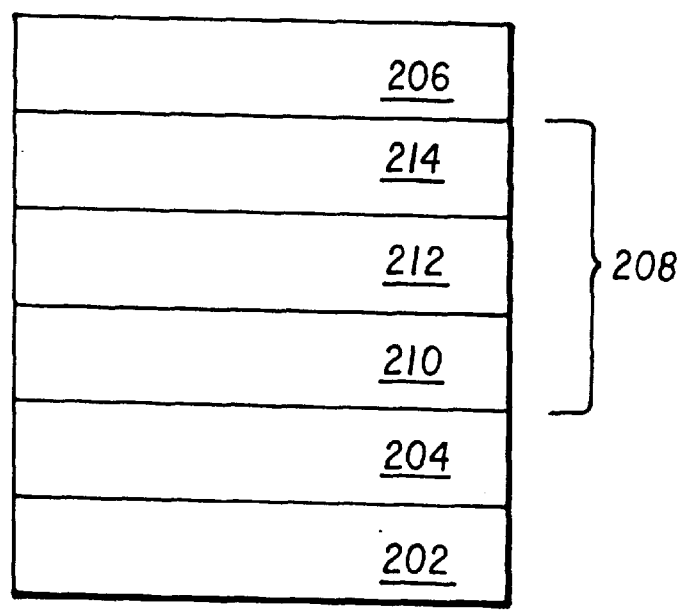

Organic EL device 200 shown in FIG. 2 is illustrative of another preferred embodiment of the invention. The insulating and transparent support is layer 202. The anode 204 is separated from the cathode 206 by an EL medium 208, which, as shown, consists of three superimposed layers of organic thin films. Layer 210 adjacent to anode 204 is the hole-transport layer. Layer 214 adjacent to cathode 206 is the electron-transport layer. Layer 212 which is in between the hole-transport layer 210 and the electron transport layer 214 is the luminescent layer. This luminescent layer 212 also serves as the recombination layer where the hole and electron recombines.

The configurations of devices 100 and 200 are similar, except that an additional luminescent layer is introduced in device 200 to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as a high luminance efficiency. Likewise, the electron transport layer 214 and hole transport layer 210 can be optimized primarily for the carrier transport property.

Figure 3:
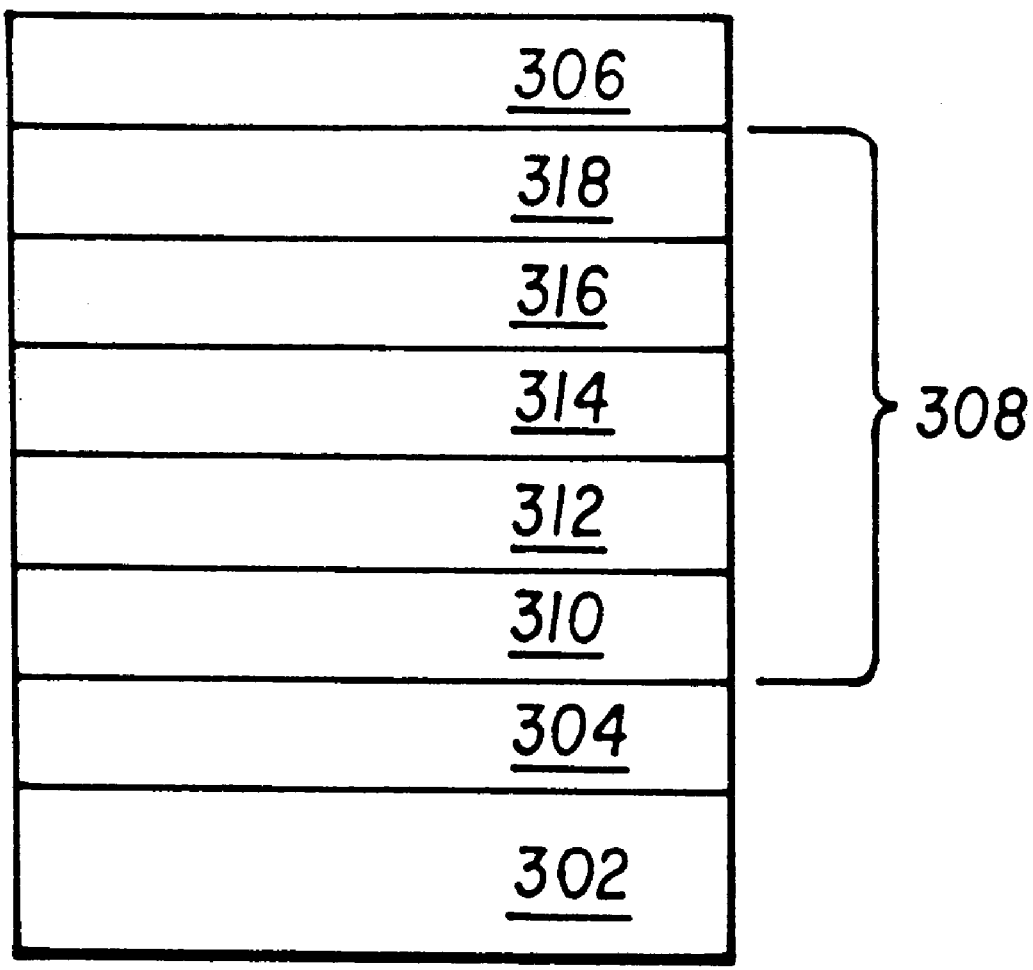

Organic EL device 300 shown in FIG. 3 is illustrative of yet another preferred embodiment of the present invention. The insulating and transparent support is layer 302. The anode 304 is separated from the cathode 306 by an EL medium 308, which, as shown, consists of five superimposed layers of organic thin films. Located on top of the anode 304 are, in sequence, the hole-injection layer 310, the hole-transport layer 312, the luminescent layer 314, the electron-transport layer 316, and the electron-injection layer 318. The structure of device 300 is similar to device 200, except that a hole-injection layer 310 and an electron injection layer 318 are added to improve the injection efficiency of the respective anode 304 and cathode 306. It is understood that an EL device may be constructed having either the hole or electron injection layer (310 and 318, respectively) present in the organic EL medium without unduly compromising the device performance.

One particular compound that is effective is

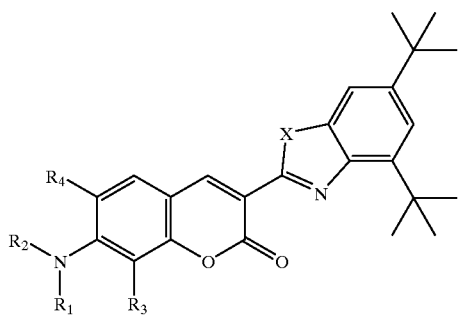

wherein:

X=S, or O $R_1$, and $R_2$ are individually alkyl of from 1 to 20 carbon atoms, aryl or carbocyclic systems; and $R_3$, and $R_4$ are individually alkyl of from 1 to 10 carbon atoms, or a branched or unbranched 5 or 6 member substituent ling connecting with $R_1$, $R_2$ respectively; and More particularly, $R_1$, $R_2$, $R_3$ and $R_4$ can be methyl, ethyl, propyl, n-butyl, i-propyl; or aryl. Also $R_3$ and $R_4$ can be arranged respectively with $R_1$ and $R_2$ so that $R_1$, $R_3$=$R_2$, $R_4$ is [$CH_2CH_2$], [$CH_2CH_2CH_2$], [$CH_2CH_2C(CH_3)_2$]

In EL devices the following compound structure has been found to be particularly effective.

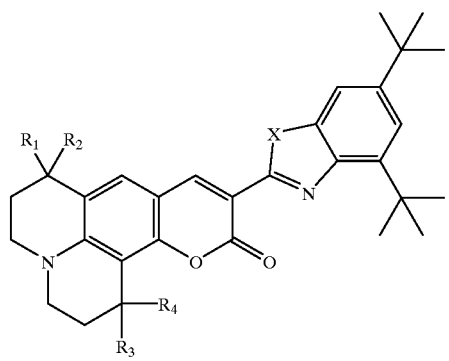

wherein:

$R_1$, $R_2$, $R_3$, and $R_4$ are individually alkyl of from 1 to 10 carbon atoms or aryl; and X is O or S.

The support layer for the EL devices 100, 200, and 300 is electrically insulating and light transparent. The light transparent property is desirable for viewing the EL emission through the support layer. For applications where the EL emission is viewed through the top electrode, the transmissive characteristic of the support is immaterial, and therefore any appropriate support layer such as opaque semiconductor and ceramic wafers can be used. Of course, it is necessary to provide in these device configurations a light transparent top electrode.

The composition of the organic EL medium is described as follows, with particular reference to device structure 300.

A layer containing a porphyrinic compound forms the hole injecting layer of the organic EL device. A porphyrinic compound is any compound, natural or synthetic, which is derived from or includes a porphyrin structure, including porphine itself. Any of the prophyrinic compounds disclosed by Adler, U.S. Pat. No. 3,935,031 or Tang U.S. Pat. No. 4,356,429, the disclosures of which are here incorporated by reference, can be employed.

Preferred porphyrinic compounds are those of structural formula (II):

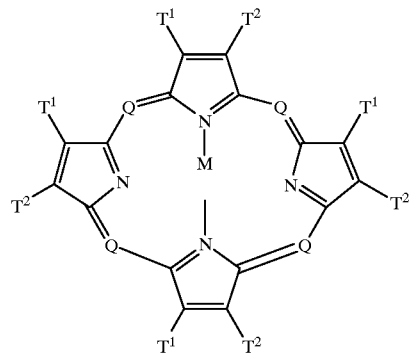

(II)

wherein

Q is —N= or —C(R)=;

M is a metal, metal oxide, or metal halide;

R is hydrogen, alkyl, aralkyl, aryl, or allkaryl; and $T^1$ and $T^2$ represent hydrogen or together complete a unsaturated six member ring, which can include substituents, such as alkyl or halogen. Preferred six membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (III):

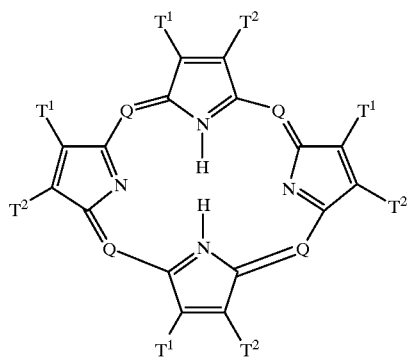

(III)

Highly preferred examples of useful porphyrinic compounds are metal free phthalocyanines and metal containing phthalocyanines. While the porphyrinic compounds in general and the phthalocyanines in particular can contain any meal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

Prophine 1,10,15,20-tetraphenyl-21H,23H-porphine copper (II)

1,10,15,20-tetrapheyl-21H,23H-porphine zinc (II)

Copper phthlocyanine

Chromium phthalocyanine fluoride

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

Another class of aromatic tertiary amines are those which include at least two aromatic tertiary amine moieties. Such compounds include those represented by structural formula (IV):

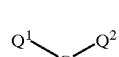

(IV)

wherein

Q$^1$ and Q$^2$ are independently aromatic tertiary amine moieties; and

G is a linking group such as an arylene, cycloalkylene, or alkylene group of a carbon to carbon bond.

A preferred class of triarylamines satisfying structural formula (IV) and containing two triarylamine moieties are those satisfying structural formula (V):

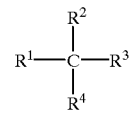

(V)

where

R$^1$ and R$^2$ each independently represents a hydrogen atom, an aryl group, or an alkyl group or R$^1$ and R$^2$ together represent the atoms completing a cycloalkyl group; and R$^3$ and R$^4$ each independently represents an aryl group which is in turn substituted with a diaryl substituted amino group, as indicated by structural formula (VI):

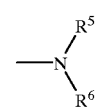

(VI)

wherein R$^5$ R$^6$ are independently selected aryl groups.

Another preferred class of aromatic tertiary amines are tetraaryldiamines. Preferred tetraaryldiamines include two diarylamino groups, such as indicated by formula (VII), linked through an arylene group:

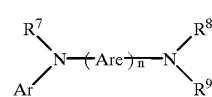

(VII)

wherein

Are is an arylene group, n is an integer of from 1 to 4; and

Ar, R$^7$, R$^8$, and R$^9$ are independently selected aryl groups.

The various alkyl, alkylene, aryl, and arylene moieties of the foregoing structural formulae (IV), (V), (VII), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Illustrative of useful hole transport compounds are the following:

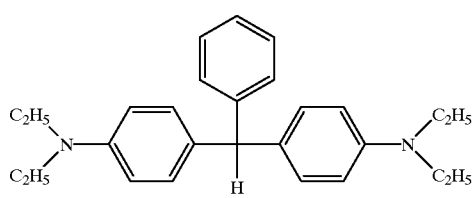

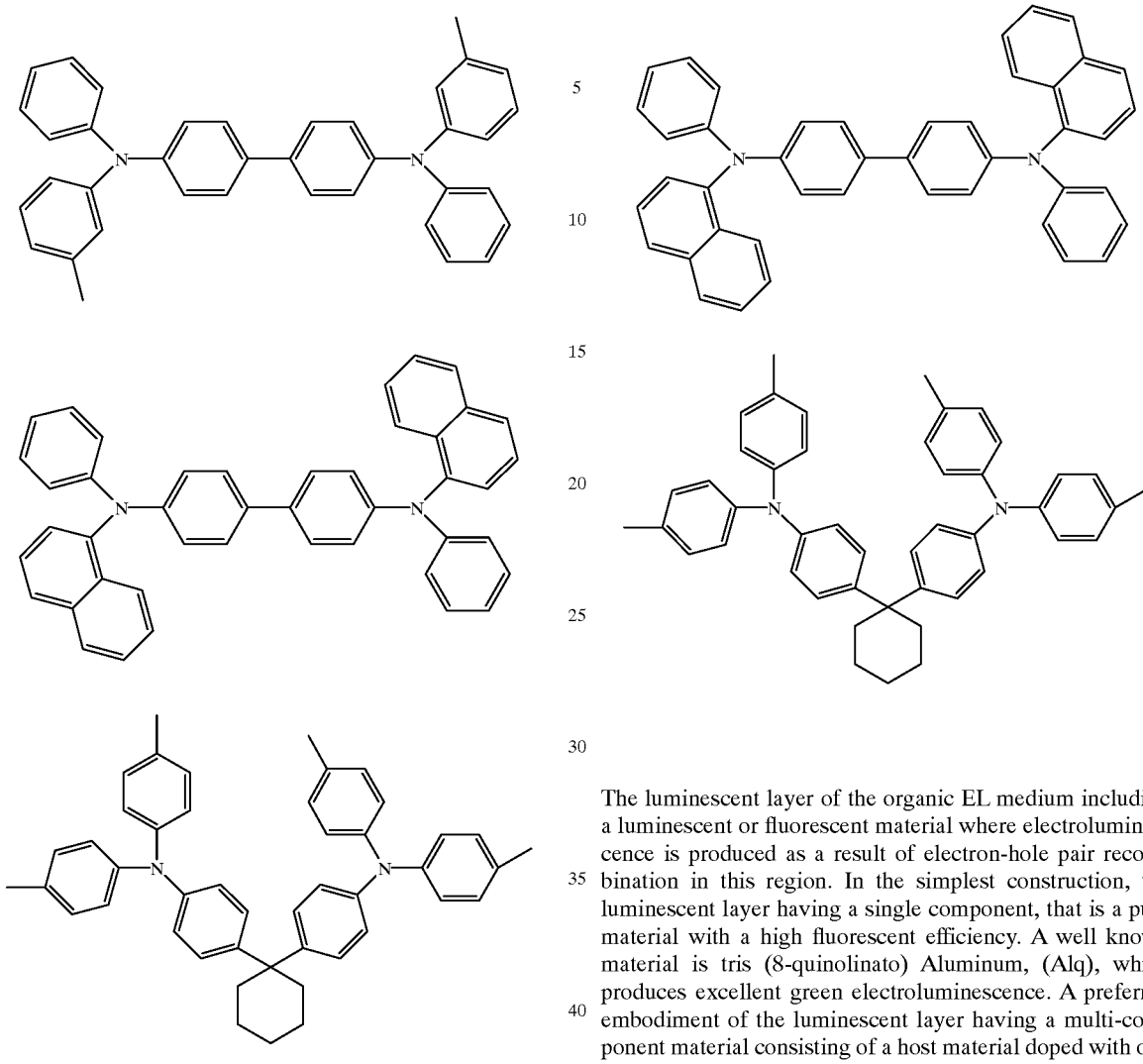

The luminescent layer of the organic EL medium including a luminescent or fluorescent material where electroluminescence is produced as a result of electron-hole pair recombination in this region. In the simplest construction, the luminescent layer having a single component, that is a pure material with a high fluorescent efficiency. A well known material is tris (8-quinolinato) Aluminum, (Alq), which produces excellent green electroluminescence. A preferred embodiment of the luminescent layer has a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et [J. Applied Physics, Vol. 65, Pages 3610–3616, 1989; U.S. Pat. No. 4,769,292].

The luminescent layer of the organic EL medium including a luminescent or fluorescent material where electroluminescence is produced as a result of electron-hole pair recombination in this region. In the simplest construction, the luminescent layer having a single component, that is a pure material with a high fluorescent efficiency. A well known material is tris (8-quinolinato) Aluminum, (Alq), which produces excellent green electroluminescence. A preferred embodiment of the luminescent layer having a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et [J. Applied Physics, Vol. 65, Pages 3610–3616, 1989; U.S. Pat. No. 4,769,292].

An important relationship for choosing a fluorescent dye as a dopant capable of modifying the hue of light emission when present in a host material is a comparison of their bandgap potential which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material. An advantage of using a green host such as Alq is that its bandgap is sufficiently large to effect energy transfer to fluorescent dyes emitting in the green, such as C-6 and C-545T and improved green fluorescent compounds described in this invention.

In the practice of the present invention, the host material forming the EL luminescent layer where light is emitted in response to electron-hole recombination including Alq. The dopants for the host Alq include the green fluorescent dyes as depicted in Formula above. Efficient green electroluminescence with brilliant hue can be readily obtained when this green dopant is used in layer 112 of FIG. 1, layer 212 of FIG. 2 or layer 314 of FIG. 3.

The following molecular structures constitute specific examples of preferred green fluorescent compounds (dyes) satisfying the requirement of the invention:

C-545TB

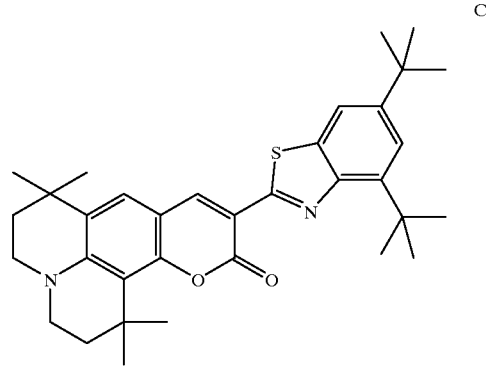

C-6DB

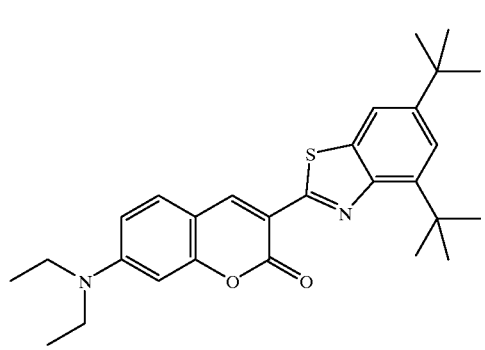

C-525TB

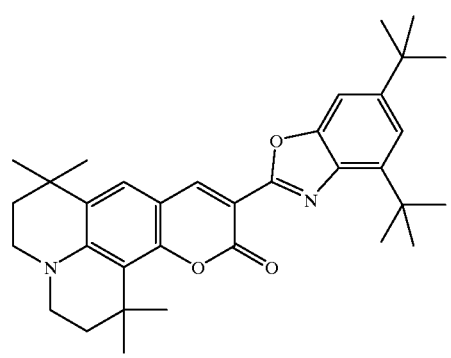

For comparison purpose, the following structures illustrate the green dopants known in the art.

C-545T

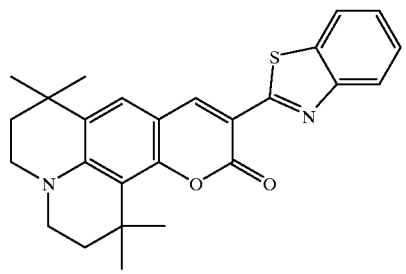

C-6

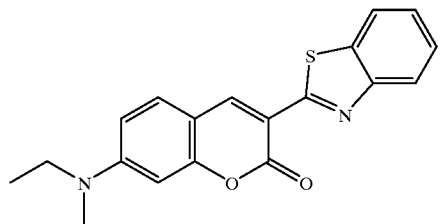

C-525T

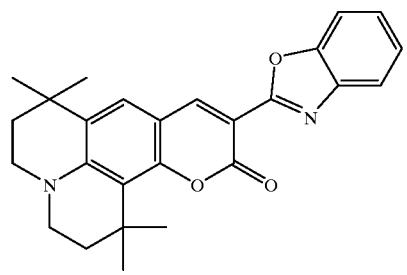

Scheme 1 shows the synthetic sequence for the new fluorescent dyes disclosed in this invention.

Scheme 1. Synthesis of New Green Doplants

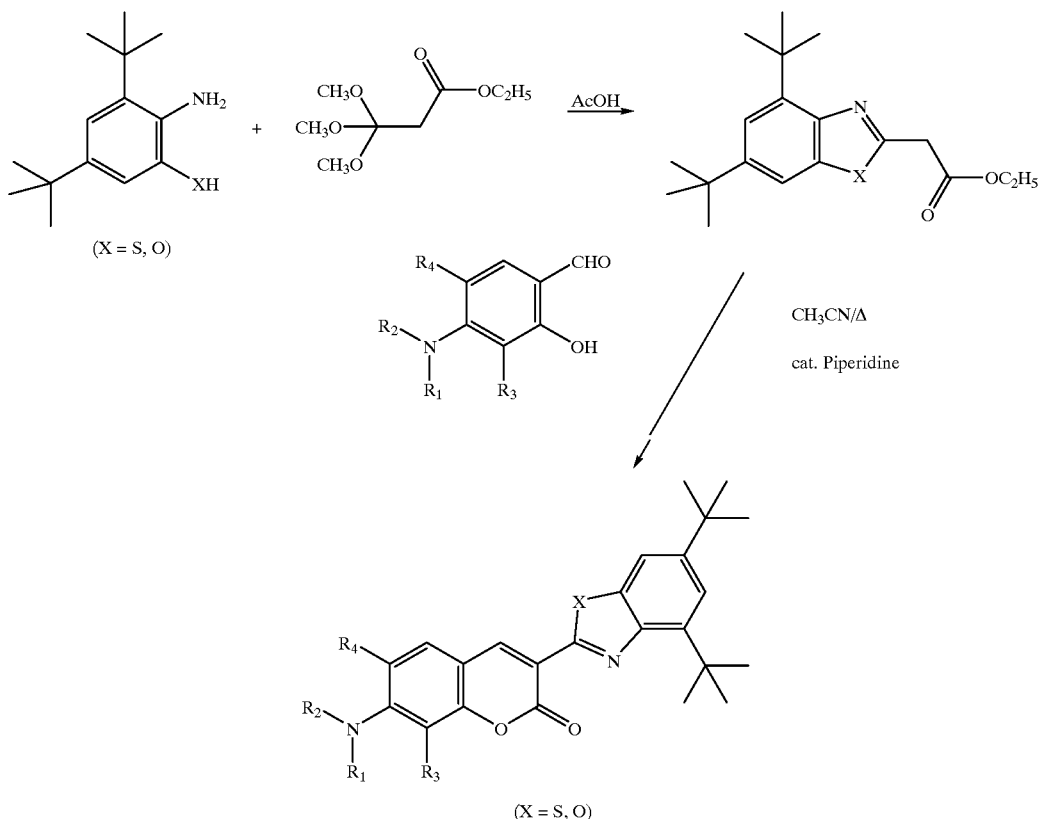

Comparison of thermal properties and EL device performances of these new materials used as green dopants in Alq is made in Table 1 and Table 2, respectively.

TABLE 1

Comparison of DSC and TGA Data

| Dyes | Tg °C. | Tm °C. | $T_{dec}$ °C. |
|---|---|---|---|
| C-6 | —[1] | 209 | 317 |
| C6DB | 107 | 286 | 348 |
| C-545T | 100 | 230 | 318 |
| C-545TB | 142 | 276 | 327 |
| C-525T | 95 | 274 | 311 |
| C-525TB | 118 | 252 | 318 |

[1]Due to high degree of crystallinity, no observable Tg was detected in DSC analysis It is evident from Table 1 that these new dyes all exhibit higher glass transition temperature (Tg), melting temperature (Tm), and decomposition temperature ($T_{dec}$) than those of their counter part, C-6, C-545T and C-525T, respectively. Higher $T_{dec}$ threshold is also advantageous in preventing emissive materials from thermal decomposition during evaporation.

TABLE 2

Comparison of EL Performances

| Dye | mol % in Alq | EL Cell | $V^3$ | $cd/m^3$ | cd/A | lm/W | CIEx | CIEy |
|---|---|---|---|---|---|---|---|---|
| C-6 | 0.8 | A[1] | 7.9 | 1447 | 7.23 | 2.87 | 0.286 | 0.625 |
| C-6DB | 0.8 | A | 8.2 | 1683 | 8.42 | 3.24 | 0.286 | 0.623 |
| C-6 | 0.7 | B[2] | 9.3 | 1615 | 8.07 | 2.72 | 0.275 | 0.633 |
| C-6DB | 0.7 | B | 11.8 | 2150 | 10.75 | 2.86 | 0.281 | 0.635 |
| C-545T | 1 | A | 6.8 | 1748 | 8.74 | 4.05 | 0.325 | 0.627 |
| C-545TB | 1 | A | 6.9 | 2014 | 10.07 | 4.62 | 0.322 | 0.629 |
| C-545T | 1 | B | 11.1 | 2364 | 10.45 | 3.34 | 0.295 | 0.648 |
| C-545TB | 1 | B | 11.6 | 2585 | 12.93 | 3.50 | 0.302 | 0.644 |

[1]ITO/NPB/Dopant(x %)/Alq/Alq/Mg:Ag
[2]ITO/CuPc/Dopant(x %)/Alq/Alq/Mg:Ag
[3]Drive current = 20 mA/cm$^2$ It is also evident from Table 2 that higher EL efficiencies are obtained using the new green dopants in place of the dopants C-6 and C-545T, respectively. The unexpected enhancements are manifested in both the cell configuration A and B independent of the presence of hole injection layer, CuPc. Moreover, the green emissions from the high Tg dopants, C-6DB and C-545TB are not significantly different from those of C-6 and C-545T, respectively. In other words, the substitution of di-t-butyl group on the benzothiazole or benzoxazole ring does not effect the color of the emission. It only provides the advantages of increasing the Tg of the dyes and enhancing their EL efficiency.

Scheme 1. Synthesis of New Green Doplants

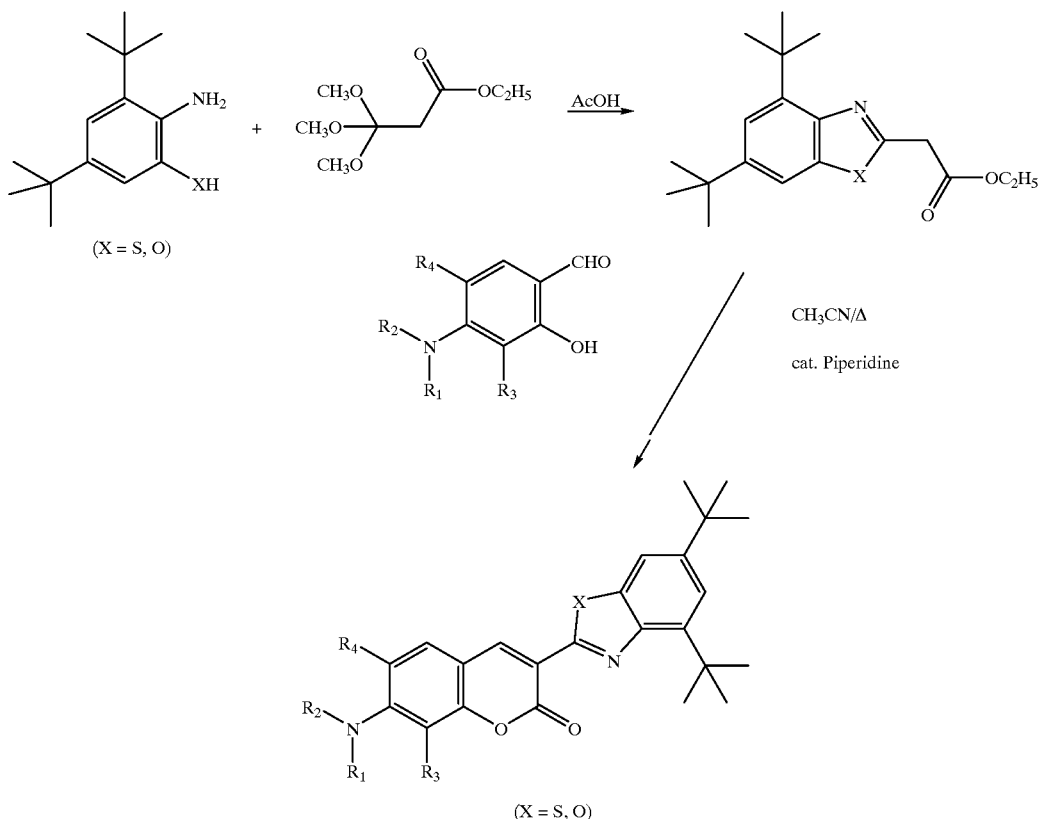

Preferred materials for use in forming the electron transporting layer of the organic EL devices of this invention are metal chelated oxinoid compounds, including chelates of oxine itself (also commonly referred to as 8-quinolinol or 8-hydroxyquinoline) hydroxyquinoline). Such compounds exhibit both high levels of performance and are readily fabricated in the form of thin films. Exemplary of contemplated oxinoid compounds are those satisfying the following structural formula:

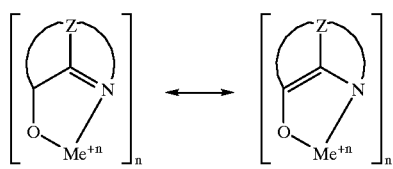

wherein

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

Aluminum trisoxine [a.k.a, tris(8-quinolinol)aluminum]

Magnesium bisoxine [a.k.a. bis(8-quinolinol)-magnesium]

Indium trisoxine [a.k.a., tris(8-quinolinol)indium]

Lithium oxine (a.k.a., 8-quinolinol lithium)

The preferred materials for the multi-layers of the organic EL medium are each capable of film-forming-that is, capable of being fabricated as a continuous layer having a thickness of less than 5000 Å. A preferred method for forming the organic EL medium is by vacuum vapor deposition. Extremely thin defect-free continuous layers can be formed by this method. Specifically, the individual layer thickness as low as about 50 Å can be constructed while still realizing satisfactory EL device performance. It is generally preferred that the overall thickness of the organic EL medium be at least about 1000 Å.

Other methods for forming thin films in EL devices of this invention include spin-coating from a solution containing the EL material. A combination of spin-coating method and vacuum vapor deposition method is also useful for the fabrication of multi-layer EL devices.

The anode and cathode of the organic EL device can each take any convenient conventional form. Where it is intended to transmit light from the organic EL device through the anode, this can be conveniently achieved by coating a thin conductive layer onto a light transparent support layer—e.g., a transparent or substantially transparent glass plate or plastic film. In one form the organic EL devices of this invention can follow the historical practice of including a light transparent anode formed of tin oxide or indium tin oxide coated on a glass plate, as disclosed by Gurnee et al U.S. Pat. No. 3,172,862, Gurnee U.S. Pat. No. 3,173,050, Dresner "Double Injection Electroluminescence in Anthracene", RCA Review, Volume 30, pages 322–334, 1969; and Dresner U.S. Pat. No. 3,710,167 cited above.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein.

EXAMPLES

According to the synthetic sequences outlined in Scheme 1, the invention and its advantages are further illustrated by the specific examples as follows:

Example 1
Synthesis of C-545TB

A mixture of 40 g of 3,5-di(t-butyl)-2-mercaptoaniline [prepared according to a literature procedure from 3,5-di(t-butyl)benzoic acid] and 75 mL of ethyl 3-(trimethoxy)propionate in 1.2 L of methanol containing 1.5 g of p-toluenesulfonic acid was stirred at r.t. for 18 h. Excess methanol was removed by rotary evaporation. The precipitated the solid was filtered and washed with cold methanol. The crude product was purified by flash chromatography on silica gel and eluted with heptane to give 20 g of ethyl 2-[5,7-di(t-butyl)benzothiazolyl]acetate. The latter was refluxed with 16 g of 1,1,7,7-tetramethyl-8-hydroxy-9-formyljulolidine in 200 mL of acetonitrile containing 4 mL of piperidine for 18 h. The reaction mixture was cooled and the precipitated bright orange solid was filtered to give 13 g of the desired dye C-545TB: m.p. 275–276° C.; Tg=140° C.

Example 2
Synthesis of C-6DB

A mixture of 4 g of ethyl 2-[5,7-di(t-butyl)benzothiazolyl]acetate and 2.32 g of N,N-di(ethyl)salicylic aldehyde in 50 mL of acetonitrile containing 0.4 mL of piperidine was refluxed for 20 h. The mixture was cooled and the precipitated bright yellow solid was filtered and washed with a small amount of cold acetonitrile to give 1.86 g of pure dye C-6DB: m.p. 285.4–287° C.; Tg=107° C.; ES$^+$ mass spectrum: m/e 463 ($M^+$-1).

Example 3
Synthesis of C-525TB

A mixture of 2.6 g of 3,5-di(t-butyl)-2-aminophenol and 5 g of ethyl 3-(trimethoxy)propionate in 20 mL of ethanol containing 0.16 g of p-toluenesulfonic acid was refluxed for 18 h. Ethanol was removed by rotary evaporation and the residue was dissolved in ether, washed with aqueous sodium bicarbonate solution to neutral. The organic phase was separated, dried with magnesium sulfate and rotary evaporated to give a brown oil which was purified by vacuum distillation at 152–4° C./0.5 mm, to give 2.1 g (56% yield) of pure ethyl 2-[5,7-di(t-butyl)benzoxazolyl]acetate. The latter was refluxed with 1.81 g of 1,1,7,7-tetramethyl-8-hydroxy-9-formyljulolidine in 25 mL of acetonitrile containing 0.3 mL of piperidine as base catalyst for 18 h. Upon cooling, the reaction mixture precipitated a bright yellow solid which was filtered and washed with a small amounts of cold acetonitrile to give 1.92 g of pure dye C-525TB: m.p. 251.5° C.; Tg=118° C.

Example 4
Synthesis of C-525T

A mixture of 2.05 g of ethyl 2-(benzoxazolyl)acetate was refluxed with 2.74 g of 1,1,7,7-tetramethyl-8-hydroxy-9-formyljulolidine in 25 mL of acetonitrile containing 0.3 mL of piperidine as a base catalyst for 18 h. Upon cooling, acetonitrile was removed from the mixture by rotary evaporation. The residue was added ether which precipitated a bright orange solid. This was filtered and washed with ether and recrystallized from 50 mL of toluene to give 1.35 g of pure dye C-525T: m.p. 274–275° C.; Tg=95° C.

Example 5
Synthesis of C-545T

A mixture of 12.28 g of ethyl 2-(benzothiazolyl)acetate was refluxed with 15 g of 1,1,7,7-tetramethyl-8-hydroxy-9-formyljulolidine in 120 mL of acetonitrile containing 2 mL of piperidine as a base catalyst for 15 h. Upon cooling, the precipitated bright orange solid was filtered and washed with some acetonitrile to give 19 g (79% yield) of pure dye C-545T: m.p. 229–230° C.; Tg=100° C.

Example 6
EL Device Fabrication and Performance

An EL device satisfying the requirements of the invention was constructed in the following manner. For comparison, this example illustrates an organic EL device where the EL medium contains a green fluorescent C-6 (prior art) doped luminescent layer. The organic EL medium has three organic layers, namely, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to oxygen plasma followed by CFx plasma treatment.

(b) Onto the treated ITO glass substrate was deposited a hole transport layer of N,N'-bis-(1-naphthyl)-N,N'-diphenylbenzidine (600 Å), also by evaporation from a tantalum boat.

(c) A luminescent layer of Alq (375 Å) mixed 0.8(mole %) of the green fluorescent dopant—C-6 was then codeposited onto the hole-transport layer.

(d) A electron-transport layer of Alq (375 Å) was then deposited onto the luminescent layer.

(e) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 1447 cd/m$^2$ when it was driven by a current source of 20 mA/cm$^2$ and a bias voltage of 7.9 volts. Its radiance is 3.08 W/Sr/m$^2$ and EL efficiency is 2.87 lm/W with a yield of 7.23 cd/A. Peak emission wavelength is 516 nm with a half-bandwidth of 60 nm. The EL color is red with 1931 CIE color coordinates of x=0.286 and y=0.625. This EL spectrum indicates that the green EL emission originates from the doped luminescent layer.

Example 7

This example illustrates the advantage of fabricating an organic EL device where the EL medium contains the new green fluorescent C-6DB doped luminescent layer. The organic EL medium has three organic layers, namely, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to oxygen plasma followed by CFx plasma treatment.

(b) Onto the treated ITO glass substrate was deposited a hole transport layer of N,N'-bis-(1-naphthyl)-N,N'-diphenylbenzidine (600Å), also by evaporation from a tantalum boat.

(c) A luminescent layer of Alq (375 Å) mixed 0.8(mole %) of the green fluorescent dopant—C-6DB was then codeposited onto the hole-transport layer.

(d) A electron-transport layer of Alq (375 Å) was then deposited onto the luminescent layer.

(e) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL, device was 1683 cd/m$^2$ when it was driven by a current source of 20 mA/cm$^2$ and a bias voltage of 8.2 volts. Its radiance is 3.59 W/Sr/m$^2$ and EL efficiency is 3.24 lm/W with a yield of 8.42 cd/A. Peak emission wavelength is 512 nm with a half-bandwidth of 68 nm. The EL color is green with 1931 CIE color coordinates of x=0.286 and y=0.623. This EL spectrum indicates that the green EL emission originates from the doped luminescent layer.

Example 8

This example illustrates the advantage of fabricating an organic EL device where the EL medium contains the known green fluorescent C-6 doped luminescent layer. The organic EL medium has four organic layers, namely, a hole-injection layer, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to ultraviolet light and ozone for a few minutes.

(b) A hole injection layer of copper phthalocyanine (150 Å) was then deposited on top of the ITO coated substrate by evaporation from a tantalum boat.

(c) Onto the copper phthalocyanine layer was deposited a hole transport layer of N,N'-bis-(1-naphthyl)-N,N'-diphenylbenzidine (600 Å), also by evaporation from a tantalum boat.

(d) A layer of doped Alq (375 Å) was then deposited onto the hole-transport layer. The doped layer contains 0.7 mol % of the green fluorescent C-6 which was co-deposited with the Alq to form a uniform doped luminescent layer.

(e) A electron-transport layer of Alq (350 Å) was then deposited onto the luminescent layer.

(f) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 1615 cd/m$^2$ when it was driven by a current source of 20 mA/c m$^2$ and a bias voltage of 9.3 volts. The EL color is green with 1931 CIE color coordinates of x=0.275 and Y=0.633. Its radiance is 3.39 W/Sr/m$^2$ and EL efficiency is 2.72 lm/W with a yield of 8.07 cd/A. The EL spectrum has a peak emission at 516 nm with a half bandwidth of 60 nm. This EL spectrum indicates that EL emission originates from the green fluorescent dye doped Alq layer.

Example 9

This example illustrates the advantage of fabricating an organic EL device where the EL medium contains the new green fluorescent C-6DB doped luminescent layer. The organic EL medium has four organic layers, namely, a hole-injection layer, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to ultraviolet light and ozone for a few minutes.

(b) A hole injection layer of copper phthalocyanine (150 Å) was then deposited on top of the ITO coated substrate by evaporation from a tantalum boat.

(c) Onto the copper phthalocyanine layer was deposited a hole transport layer of N,N'-bis-(1-naphthyl)-N,N'-diphenylbenzidine (600 Å), also by evaporation from a tantalum boat.

(d) A layer of doped Alq (375 Å) was then deposited onto the hole-transport layer. The doped layer contains 0.7 mol % of the green fluorescent C-6 which was co-deposited with the Alq to form a uniform doped luminescent layer.

(e) A electron-transport layer of Alq (350 Å) was then deposited onto the luminescent layer.

(f) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 2150 cd/m$^2$ when it was driven by a current source of 20 mA/c m$^2$ and a bias voltage of 11.8 volts. The EL color is green with 1931 CIE color coordinates of x=0.281 and Y=0.635. Its radiance is 4.47 W/Sr/m$^2$ and EL efficiency is 2.86 lm/W with a yield of 10.75 cd/A. The EL spectrum has a peak emission at 516 nm with a half bandwidth of 64 nm. This EL spectrum indicates that EL emission originates from the green fluorescent dye doped Alq layer.

Example 10

This example illustrates a fabricated organic EL device where the EL medium contains the known green fluorescent C-545T doped luminescent layer. The organic EL medium has three organic layers, namely, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to oxygen plasma followed by CFx plasma treatment.

(b) Onto the ITO glass substrate was deposited a hole transport layer of N,N'-bis-(1-naphthyl)-N,N'-diphenylbenzidine (600 Å), also by evaporation from a tantalum boat.

(c) A layer of doped Alq (375 Å) was then deposited onto the hole-transport layer. The doped layer contains 1 mol % of the green fluorescent C-545T which was co-deposited with the Alq to form a uniform doped luminescent layer.

(d) A electron-transport layer of Alq (350 Å) was then deposited onto the luminescent layer.

(e) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 1748 cd/m$^2$ when it was driven by a current source of 20 mA/c m$^2$ and a bias voltage of 6.8 volts. The EL color is green with 1931 CIE color coordinates of x=0.325 and Y=0.627. Its radiance is 3.38 W/Sr/m$^2$ and EL efficiency is 4.05 lm/W with a yield of 8.74 cd/A. The EL spectrum has a peak emission at 524 nm with a half bandwidth of 68 nm. This EL spectrum indicates that EL emission originates from the green fluorescent dye doped Alq layer.

Example 11

This example illustrates the advantage of fabricating an organic EL device where the EL medium contains the new green fluorescent C-545TB doped luminescent layer. The organic EL medium has three organic layers, namely, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to oxygen plasma followed by CFx plasma treatment.

(b) Onto the ITO glass substrate was layer was deposited a hole transport layer of N,N'-bis-(1-naphthyl)-N,N'-diphenylbenzidine (600 Å), also by evaporation from a tantalum boat.

(c) A layer of doped Alq (375 Å) was then deposited onto the hole-transport layer. The doped layer contains 1 mol % of the green fluorescent C-545TB which was co-deposited with the Alq to form a uniform doped luminescent layer.

(d) A electron-transport layer of Alq (350 Å) was then deposited onto the luminescent layer.

(e) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 2014 cd/m$^2$ when it was driven by a current source of 20 mA/c m$^2$ and a bias voltage of 6.9 volts. The EL color is green with 1931 CIE color coordinates of x=0.322 and Y=0.629. Its radiance is 3.89 W/Sr/m$^2$ and EL efficiency is 4.62 lm/W with a yield of 10.07 cd/A. The EL spectrum has a peak emission at 524 nm with a half bandwidth of 64 nm. This EL spectrum indicates that EL emission originates from the green fluorescent dye doped Alq layer.

Example 12

This example illustrates the advantage of fabricating an organic EL device where the EL medium contains the known green fluorescent C-545T doped luminescent layer. The organic EL medium has four organic layers, namely, a hole-injection layer, a hole transport layer, a doped luminescent layer, and an electron-transport layer.

(a) An indium-tin-oxide (ITO) coated glass substrate was sequentially ultrasonicated in a commercial detergent, rinsed in deionized water, degreased in toluene vapor and exposed to ultraviolet light and ozone for a few minutes.

(b) A hole injection layer of copper phthalocyanine (150 Å) was then deposited on top of the ITO coated substrate by evaporation from a tantalum boat.

(c) Onto the copper phthalocyanine layer was deposited a hole transport layer of N,N'-bis-(1-naphthyl)-N,N'-diphenylbenzidine (600 Å), also by evaporation from a tantalum boat.

(d) A layer of doped Alq (375 Å) was then deposited onto the hole-transport layer. The doped layer contains 1 mol % of the green fluorescent C-545T which was co-deposited with the Alq to form a uniform doped luminescent layer.

(e) A electron-transport layer of Alq (350 Å) was then deposited onto the luminescent layer.

(f) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 2364 cd/m$^2$ when it was driven by a current source of 20 mA/c m$^2$ and a bias voltage of 11.1 volts. The EL color is green with 1931 CIE color coordinates of x=0.295 and Y=0.648. Its EL efficiency is 3.34 lm/W with a yield of 10.45 cd/A. The EL spectrum has a peak emission at 524 nm with a half bandwidth of 56 nm. This EL spectrum indicates that EL emission originates from the green fluorescent dye doped Alq layer.

Example 13

This example illustrates the advantage of fabricating an organic EL device where the EL medium contains the new green fluorescent C-545TB doped luminescent layer. The organic EL medium has four organic layers, namely, a hole-injection layer, a hole transport layer, a doped luminescent layer, and an, electron-transport layer.

(a) An indium-tin-oxide (ITO) coated glass substrate was sequentially ultrasonicated in a commercial detergent, rinsed in deionized water, degreased in toluene vapor and exposed to ultraviolet light and ozone for a few minutes.

(b) A hole injection layer of copper phthalocyanine (150 Å) was then deposited on top of the ITO coated substrate by evaporation from a tantalum boat.

(c) Onto the copper phthalocyanine layer was deposited a hole transport layer of N,N'-bis-(1-naphthyl)-N,N'-diphenylbenzidine (600 Å), also by evaporation from a tantalum boat.

(d) A layer of doped Alq (375 Å) was then deposited onto the hole-transport layer. The doped layer contains 1 mol % of the green fluorescent C-545TB which was co-deposited with the Alq to form a uniform doped luminescent layer.

(e) A electron-transport layer of Alq (350 Å) was then deposited onto the luminescent layer.

(f) On top of the Alq layer was deposited a cathode layer (2000 Å) formed of a 10:1 atomic ratio of Mg and Ag.

The above sequence completed the deposition of the EL device. The device was then hermetically packaged in a dry glove box for protection against ambient environment.

The light output from this EL device was 2585 cd/m$^2$ when it was driven by a current source of 20 mA/c m$^2$ and a bias voltage of 11.5 volts. The EL color is green with 1931 CIE color coordinates of x=0.302 and Y=0.644. Its radiance is 5.0 W/Sr/m$^2$ and its EL efficiency is 3.50 lm/W with a yield of 12.93 cd/A. The EL spectrum has a peak emission at 524 nm with a half bandwidth of 56 nm. This EL spectrum indicates that EL emission originates from the green fluorescent dye doped Alq layer.

Reviewing the above EL device structure has been found to be quite advantages and to have unexpected results. Such an organic EL device, includes an anode and a cathode, and at least one organic luminescent layer containing a compound of the formula:

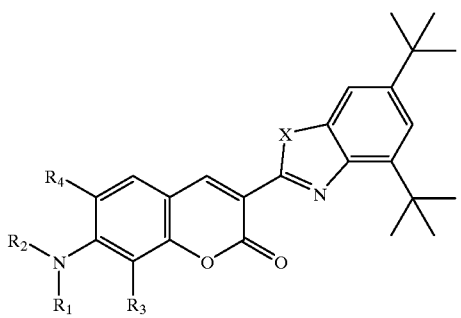

wherein:

X=S, or O $R_1$, and $R_2$ are individually alkyl of from 1 to 20 carbon atoms, aryl or carbocyclic systems; and $R_3$, and $R_4$ are individually alkyl of from 1 to 10 carbon atoms, or a branched or unbranched 5 or 6 member substituent ring connecting with $R_1$, $R_2$ respectively.

More particularly, $R_1$, $R_2$, $R_3$ and $R_4$ can be methyl, ethyl, propyl, n-butyl, i-propyl; or aryl; wherein $R_3$ and $R_4$ are arranged respectively with $R_1$ and $R_2$ so that $R_1$, $R_3$=$R_2$, $R_4$ is [CH$_2$CH$_2$], [CH$_2$CH$_2$CH$_2$], [CH$_2$CH$_2$C(CH$_3$)$_2$].

The invention has been described in detail with particular reference to certain preferred embodiments thereof, but it will be understood that variations and modifications can be effected within the spirit and scope of the invention.

PARTS LIST

100 EL Device
102 Support Layer
104 Anode
106 Cathode
108 Organic EL medium
110 Hole-transport layer
112 Electron-transport layer
114 External power source
116 Conductor
118 Conductor
120 Holes
122 Electrons
200 EL device
202 Support Layer
204 Anode
206 Cathode
208 Organic EL medium
210 Hole-transport layer
212 Luminescent layer
214 Electron-transport layer
300 EL device
302 Support Layer
304 Anode
306 Cathode
308 Organic EL medium
310 Hole-injection layer
312 Hole-transport layer
314 Luminescent layer
316 Electron-transport layer
318 Electron-injection layer

What is claimed is:

1. An organic EL device, comprising an anode and a cathode, and at least one organic luminescent layer containing a compound of the formula:

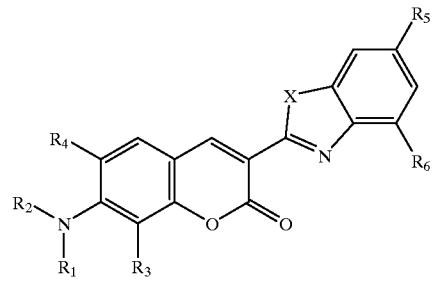

wherein:

X=S, or O $R_1$, and $R_2$ are individually alkyl of from 1 to 20 carbon atoms, aryl or carbocyclic systems;

$R_3$, and $R_4$ are individually alkyl of from 1 to 10 carbon atoms, or a branched or unbranched 5 or 6 member substituent ring connecting with $R_1$, $R_2$ respectively; and $R_5$ and $R_6$ are individually alkyl of from 1 to 20 carbon atoms, which are branched or unbranched.

2. An organic EL device, comprising an anode and a cathode, and at least one organic luminescent layer containing a compound of the formula:

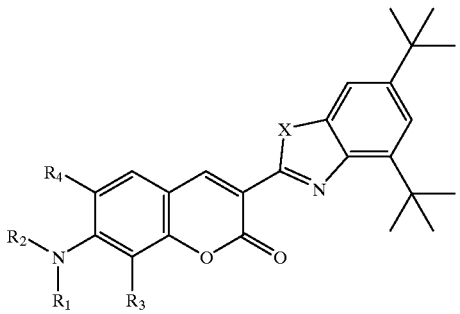

wherein:

X=S, or O $R_1$, and $R_2$ are individually alkyl of from 1 to 20 carbon atoms, aryl or carbocyclic systems; and $R_3$, and $R_4$ are individually alkyl of from 1 to 10 carbon atoms, or a branched or unbranched 5 or 6 member substituent ring connecting with $R_1$, $R_2$ respectively.

3. The organic EL device according to claim 2 wherein $R_1$, $R_2$, $R_3$ and $R_4$ are methyl, ethyl, propyl, n-butyl, i-propyl; or aryl.

4. The organic EL device according to claim 2 wherein $R_1$ is connected to $R_3$ and $R_2$ is connected to $R_4$.

5. An organic EL device, comprising an anode and a cathode, and at least one organic luminescent layer containing a compound of the formula:

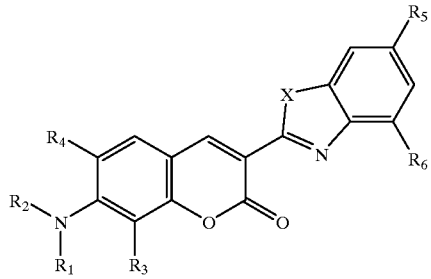

wherein:

$R_1$, $R_2$, $R_3$, and $R_4$ are individually alkyl of from 1 to 10 carbon atoms or aryl;

X is O or S; and $R_5$ and $R_6$ are individually alkyl of from 1 to 20 carbon atoms, which are branched or unbranched.

6. An organic EL device, comprising an anode and a cathode, and at least one organic luminescent layer containing a compound of the formula:

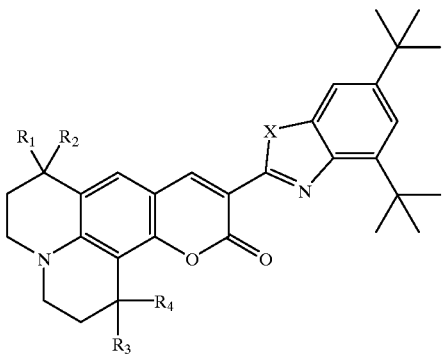

wherein:

$R_1$, $R_2$, $R_3$, and $R_4$ are individually alkyl of from 1 to 10 carbon atoms or aryl; and X is O or S.

* * * * *